(12) United States Patent
Vardeny et al.

(10) Patent No.: US 8,686,627 B2
(45) Date of Patent: Apr. 1, 2014

(54) PERFORATED-ELECTRODE ORGANIC LIGHT-EMITTING DIODES

(75) Inventors: Zeev Valentine Vardeny, Salt Lake City, UT (US); Chuanzhen Liu, Beijing (CN); Vladimir Kamaev, Saratov Region (RU)

(73) Assignee: University of Utah Research Foundation, Salt Lake City, UT (US)

( * ) Notice: Subject to any disclaimer, the term of this patent is extended or adjusted under 35 U.S.C. 154(b) by 1979 days.

(21) Appl. No.: 11/404,646

(22) Filed: Apr. 14, 2006

(65) Prior Publication Data

US 2008/0018233 A1    Jan. 24, 2008

Related U.S. Application Data

(60) Provisional application No. 60/671,659, filed on Apr. 15, 2005.

(51) Int. Cl.
*H01L 51/50* (2006.01)
(52) U.S. Cl.
USPC .............................. 313/504; 313/506; 445/24
(58) Field of Classification Search
USPC ................................. 313/501–512; 428/690
See application file for complete search history.

(56) References Cited

U.S. PATENT DOCUMENTS

| 6,639,357 | B1 * | 10/2003 | Parthasarathy et al. | 313/504 |
| 6,933,673 | B2 | 8/2005 | Yamazaki | |
| 2001/0026123 | A1 * | 10/2001 | Yoneda | 313/504 |
| 2004/0033388 | A1 * | 2/2004 | Kim et al. | 428/690 |

OTHER PUBLICATIONS

Moroz, Metallo-Dielectric Diamond and Zinc-Blende Photonic Crystals, 2002 Physical Review B 66.*

* cited by examiner

*Primary Examiner* — Mary Ellen Bowman
(74) *Attorney, Agent, or Firm* — Stoel Rives LLP

(57) ABSTRACT

An organic light emitting diode (OLED) uses a π-conjugated polymer emissive layer (MEH-PPV) sandwiched between two semitransparent electrodes. The preferred embodiment utilizes an optically thin gold film anode, whereas the cathode was in the form of an optically thick aluminum (Al) film with patterned periodic subwavelength 2D hole array that showed anomalous transmission in the spectral range of the polymer photoluminescence band. At similar current densities we obtained a seven-fold electroluminescence efficiency enhancement with the patterned Al device compared with a control device based on unperforated Al electrode.

14 Claims, 4 Drawing Sheets

PERFORATED-ELECTRODE ORGANIC LIGHT-EMITTING DIODES

REFERENCE TO RELATED APPLICATION

This application claims priority from U.S. Provisional Patent Application Ser. No. 60/671,659, filed Apr. 15, 2005, the entire content of which is incorporated by reference.

GOVERNMENT SPONSORSHIP

This invention was supported in part by the ARO Grant No. DAAD 19-03-1-0290; the NSF- NIRT Grant No. 0102964; and the DOE Grant No. FG-02-04ER46109. The United States government may have certain rights to this invention.

FIELD OF THE INVENTION

This invention relates generally to organic light-emitting diodes (OLEDs) and, in particular, to efficient apparatus and methods for extracting more electroluminescence (EL) out of an OLED device using a perforated electron-injecting cathode.

BACKGROUND OF THE INVENTION

In the simplest form of organic light emitting diodes (OLEDs) the active organic semiconductor is sandwiched between two metallic electrodes [1, 2]. Since such electrodes are usually opaque in the visible spectral range unless very thin, this type of geometry prevents efficient surface emission. This difficulty can be finessed by using a semitransparent electrode such as indium tin oxide (ITO) as the hole-injecting anode. However for the electron-injecting cathode opaque metallic electrodes such as aluminum (Al) are still been used [3]. In this OLED configuration, due to the relatively high refractive index of the organic active layer, a considerable fraction of the emitted radiation remains trapped in the device as waveguide modes that eventually couple to surface plasmons (SP) excitations on the anode surface, which consequently decay nonradiatively [4]. If nothing is done to recover this trapped waveguided light, then the device efficiency remains always low [5].

On a smooth metal-dielectric interface, light cannot efficiently couple to the SP excitations, which are the elementary excitations of the metal surface, because conservation of energy, E and momentum, k are not obeyed [6]. On an (E, k) plot the SP dispersion curve lies below that of the electromagnetic waves in vacuum [6]. But in a metal film that is perforated with a 2D periodic array of holes, the periodicity allows grating coupling of the SP to light [7]; this coupling results in surface plasmon polariton (SPP) excitations. The lattice periodicity promotes zone folding of the SP dispersion relation, which results in the formation of SP band structure that makes it possible for light to directly couple to SP excitations. Indeed it was recently found [7-18] that the optical transmission through subwavelength hole arrays fabricated on optically thick metallic films is enhanced at resonance wavelengths (or maxima), where light couples to the film's SPP excitations. If these maxima overlap with the photoluminescence (PL) band of the active organic layer of an OLED, then it might be possible to extract more EL light out of the device [5, 19-21] without compromising the current injection capability of the patterned electrode.

SUMMARY OF THE INVENTION

This invention resides in an efficient way to extract more electroluminescence (EL) out of an organic light-emitting diode (OLED) using a perforated electron-injecting cathode. This is due to an anomalous transmission caused by its patterned periodic two-dimensional (2D) subwavelength hole array comprising a 2D metallo-dielectric photonic crystal.

The preferred embodiment uses a π-conjugated polymer emissive layer (MEH-PPV) sandwiched between two semitransparent electrodes. The electro-emission light extraction from the organic layer is improved by patterning the electrodes in the form of two-dimensional hole array that forms a photonic crystal. The trapped light in the OLED cavity can then couple to the surface plasmons on the metallic electrodes, and thus be emitted outside the EM cavity with minimum loss.

The perforated electrode may be the anode, cathode or both; and this makes it possible to use many metals that were not used before as viable electrodes for OLED's. The enhanced light extraction dramatically improves the efficiency of OLED's without compromising the current density needed for high brightness.

According to the invention, we fabricated an OLED based on a perforated Al cathode in the form of a periodic 2D hole array, and compared its performance to that of a control device based on an unperforated Al electrode. The anomalous transmission through the patterned Al electrode can be well explained by resonant coupling of the incident light to SPP excitations on the two cathode interfaces, and matches the PL emission spectrum of the active polymer MEH-PPV. At similar current densities we obtained up to seven-fold increase in the EL collection efficiency from the perforated device compared to the control device. This demonstrates that the method of patterning the electrodes into 2D hole arrays is very efficient, and can be used in the future for extracting more EL in practical device applications.

DETAILED DESCRIPTION OF THE INVENTION

This invention is directed to the optical transmission, PL emission, fabrication and properties of improved organic light-emitting diodes (OLEDs). The preferred embodiment uses a π-conjugated organic polymer emissive layer (MEH-PPV) sandwiched between two semitransparent electrodes. A more preferred embodiment uses a soluble derivative of poly-p-phenylene vinylene [PPV]) sandwiched between an optically thin gold anode, and an optically thick Al film perforated with a periodic hole array used as an cathode In comparing our results to a control OLED based on an unperforated Al film with the same thickness, we found that the extraordinary transmission resonances in the Al optical spectra, which are well explained by light coupling to SPP excitations. These excitations match the PL band of the organic active layer, and thus more EL light could be extracted from the device. Indeed, we obtained a seven-fold enhancement in the extracted EL light from the perforated Al device compared with the control OLED, which we found to be in agreement with the transmission enhancement through the Al electrode.

Figure 1A:
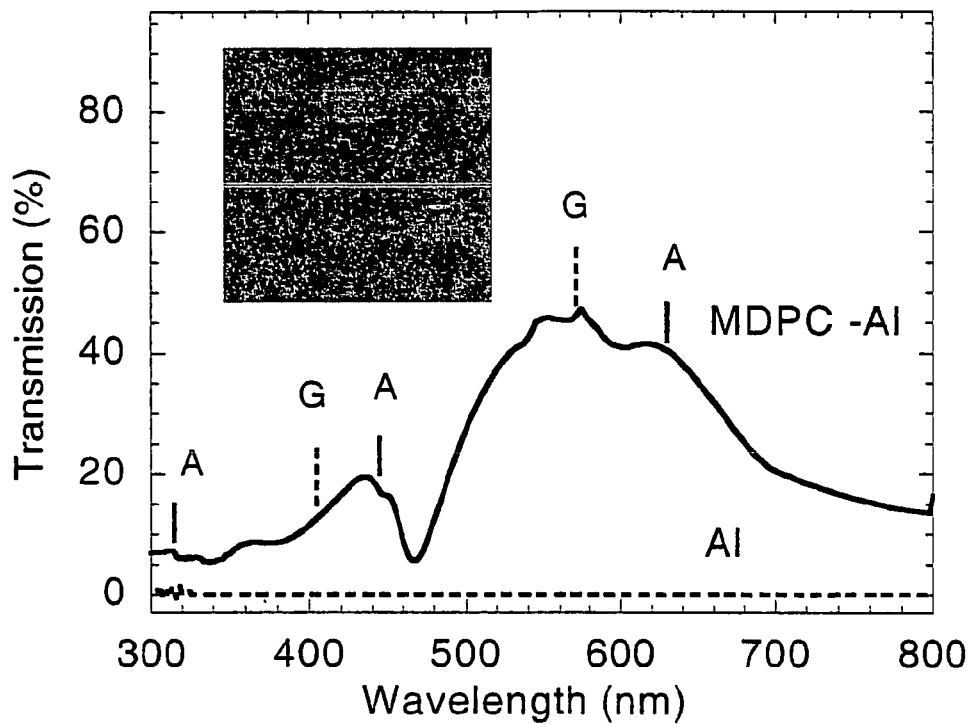
FIGS. 1A and 1B show the optical transmission spectra, T(λ), of organic light-emitting diodes (OLEDs) having certain physical characteristics.
Figure 1B:
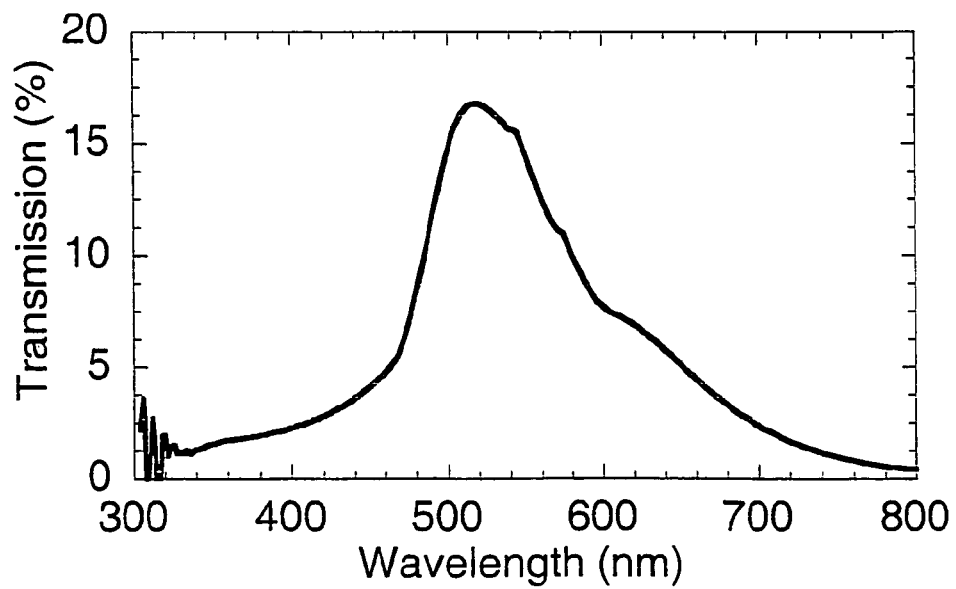

FIGS. 1A and 1B show the optical transmission spectra, $T(\lambda)$ of organic light-emitting diode (OLED) metallic electrodes; 80 nm thick Al cathode, and 70 nm thick Au anode. In FIG. 1A we compare $T(\lambda)$ of the perforated Al electrode in the form of metallic dielectric photonic crystal-MDPC as shown in the inset, to that of an unperforated Al films. The anomalous transmission bands are assigned to the SPP excitations at the air-Al (A) or glass-Al (G) interfaces by vertical full lines and dashed lines, respectively.

The cathode aluminum hole array was in the form of a square 5×5 mm$^2$ in area that was fabricated by Nanonex Corp. (Princeton, N.J.) using a nano-imprint method. The periodic hole array with square symmetry consisted of a 80 nm thick aluminum film on a glass substrate with subwavelength hole size of about 150 nm and lattice constant periodicity, $a_0$ of about 300 nm (FIG. 1A inset). The unperforated Al film used for the control OLED was fabricated by evaporating Al on glass, with the same thickness as that of the Al hole array sample.

Figure 2:
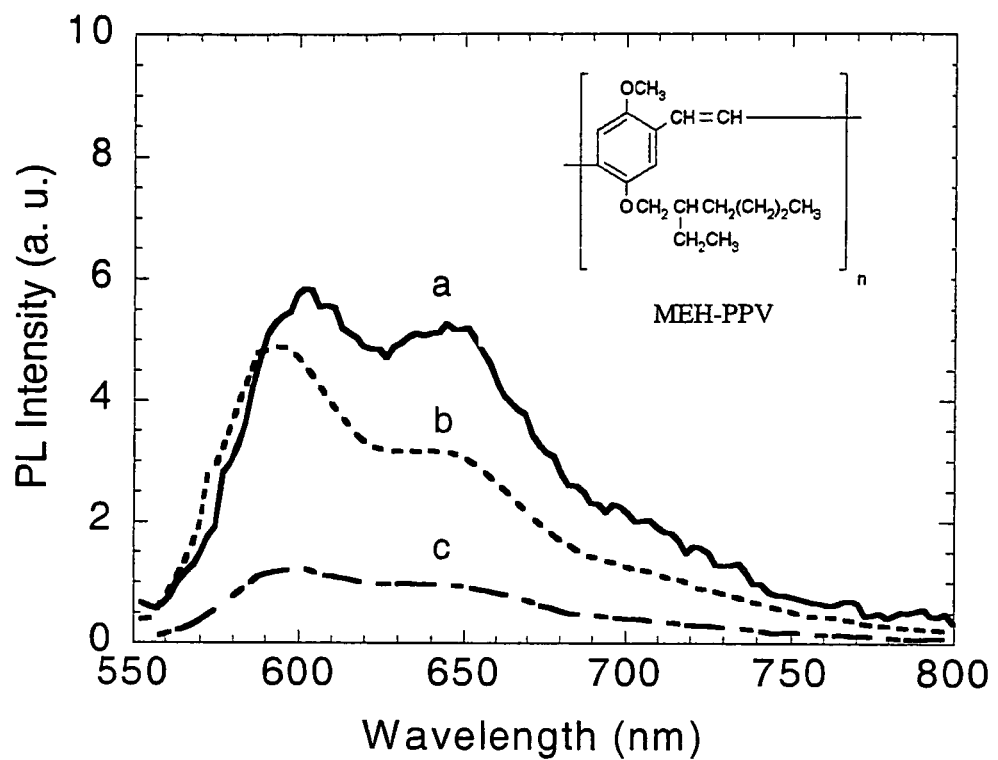
FIG. 2 shows the PL spectra of a MEH-PPV polymer film.

FIG. 2 shows the PL spectra of a MEH-PPV polymer film spin-casted on the unperforated Al (full line), and perforated Al electrodes, which are measured in reflection geometry (dashed line), and transmission geometry through the film (dotted-dashed line). The active layer of the OLED's been a soluble derivative of PPV, namely poly (2-5 methoxy-ethylhexyloxy) [MEH-PPV] of which repeat unit is shown in FIG. 2 inset. The optical transmission spectra, $T(\lambda)$ through the films were measured at room temperature using a tungsten-halogen incandescent lamp, and a homemade spectrometer. The PL spectra of the MEH-PPV films deposited on the perforated and unperforated Al electrodes were measured at room temperature, in a cryostat under dynamic vacuum to protect against photo-oxidation.

Figure 3A:
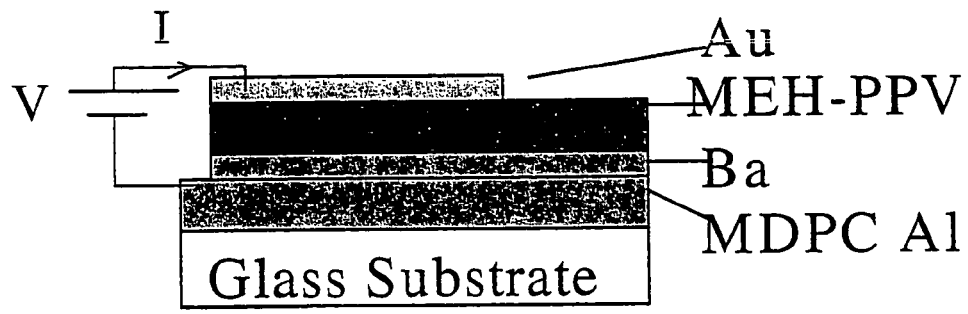
FIG. 3A shows the inverted OLED configuration that consists of three layers.

FIG. 3A shows the inverted OLED configuration that consists of three layers; an Al cathode coated with a thin Ba film for enhanced electron injecting; the active MEH-PPV polymer layer; and a gold anode. The OLED device operates at forward bias, V. The OLEDs were fabricated by the inverted method [22] in which the active layer is spin-coated on the cathode first, following by spin-coating of the anode electrode (FIG. 3A). All procedures were done in a homemade glove box, having 1 ppm of oxygen. A thin layer (2 nm thick) of barium (Ba) was first evaporated onto the perforated Al and control Al films to enhance their electron-injection capability. We then spin-casted a 130 nm thick film of MEH-PPV on the Al electrodes. The devices were completed by capping a 70 nm gold (Au), which was thermally evaporated using a shadow mask in a vacuum chamber having a pressure of $10^{-6}$ torr. The I-V characteristics and the external EL quantum efficiencies (ELQE) of the devices were measured in a glove box that was purged with dry nitrogen using a computer-controlled Kiethley 236 source and measure unit, and an integrated sphere [23] with a silicon photodiode. The ELQE was calibrated using OLED's with known ELQE that were obtained from other laboratories.

The zeroth order optical transmission, $T(\lambda)$ through the Al hole arrays in the visible/near-infrared spectral range is shown in FIG. 1A for an incident angle $\theta=0$. The spectrum is composed of several transmission resonances $\lambda_{max}$ and transmission minima $\lambda_{min}$. The features at $\lambda_{max}$ are due to extraordinary transmission resonances that are formed as the result of light coupling to SPP [7-18] giving T>25% (which is the area covered by the holes in the perforated film). This could be verified from the angular dependence of $T(\lambda)$, where a red shift in $\lambda_{max}$ was measured at $\theta>0$. The transmission minima at $\lambda_{min}$, on the contrary are due to Wood's anomalies [24]. Importantly T is maximum in the spectral range of MEH-PPV PL emission band (FIG. 2), and thus the perforated film may be efficiently used to couple EL from the OLED [25]. For comparison we plot in FIG. 1A $T(\lambda)$ of the control Al film; T is very low, less than 1 percent for the spectral range covered here. We also plot in FIG. 1B $T(\lambda)$ of the semitransparent 70 nm thick gold electrode used as a cathode in the OLED device. $T(\lambda)$ peaks at 15 percent, but T at 600 nm, which is the PL emission maximum of the PPV-MEH polymer (FIG. 2) is only about 7 percent.

In the standard aperture theory of Bethe [26], the transmission through a sub-wavelength aperture follows $(d/\lambda)^4$ dependence due to diffraction, where d is the hole diameter. Therefore the transmission in our case should have been about 0.4 percent. However $T(\lambda)$ through the Al sub-wavelength array of holes shows 'anomalous' behavior, with significant transmission at wavelengths much longer than d (FIG. 1A). The perforated metallic surface allows coupling between the incident light and SPP excitations on both sides of the film. The conservation of momentum in this case can be written as [7], $$\vec{k}_{sp} = \vec{k}_x \pm m\vec{u}_x \pm n\vec{u}_y, \qquad (1)$$

where $$|\vec{k}_x| = \left(\frac{2\pi}{\lambda}\right)$$

sin $\theta$ is the component of incident wave-vector of light in the plane of the hole array, $\vec{u}_x$ and $\vec{u}_y$ are the reciprocal lattice vectors (for a square lattice as in our case we have $$|\vec{u}_x| = |\vec{u}_y| = \frac{2\pi}{a_0}\right),$$

and m and n are integers. From the conservation of energy we get for the SP wave-vector, $k_{sp}$ on a smooth metallic film.

$$|\vec{k}_{sp}| = \frac{\omega}{c}\left(\frac{\varepsilon_m \varepsilon_d}{\varepsilon_m + \varepsilon_d}\right)^{\frac{1}{2}}, \qquad (2)$$

where $\epsilon_m$ and $\epsilon_d$ are the real parts of the dielectric constants for the metal and substrate (glass or air), respectively. At normal incidence ($\theta=0$) Eqs. (1) and (2) can be reduced to $$\lambda_{max} = \frac{a_0}{\sqrt{m^2+n^2}}\left(\frac{\varepsilon_m \varepsilon_d}{\varepsilon_m + \varepsilon_d}\right)^{\frac{1}{2}}. \qquad (3)$$

Using Eq. (3) the positions of transmission maxima $\lambda(n, m)$ can be associated with the SPP modes on the different interfaces (FIG. 1A). When taking real($\epsilon_m$)=−1.29 for the Al film, we obtain best fitted transmission maxima due to the air-Al interface at $\lambda(1, 0)$=630 nm, $\lambda(1, 1)$=445 nm, and $\lambda(2, 0)$=315 nm; whereas the glass-Al interface give maxima at $\lambda(1, 0)$=571 nm, and $\lambda(2, 0)$=405 nm. These are in very good agreement with the spectrum in FIG. 1A despite the simple model used here, which is generally used to describe holes with diameter much smaller that the lattice periodicity [9].

The transmission minimum at λ=460 nm is due to Wood's anomaly [24], and thus cannot be described by coupling to SPP excitations.

The PL spectra of MEH-PPV spin-casted on the two Al films are shown transmission and reflection geometries in FIG. 2. The PL spectra (that are not normalized) show typical phonon replicas (0-n), and indicate that a good match exists with the transmission maxima of the perforated Al film (FIG. 1A) [25], and that of the Au top electrode (FIG. 1B). The PL intensity measured in transmission is relatively strong for the perforated Al electrode due to the match with the anomalous $T(\lambda)$. On the contrary, the PL intensity measured through the control Al film (not shown) is much smaller (by about two orders of magnitude).

Figure 3B:
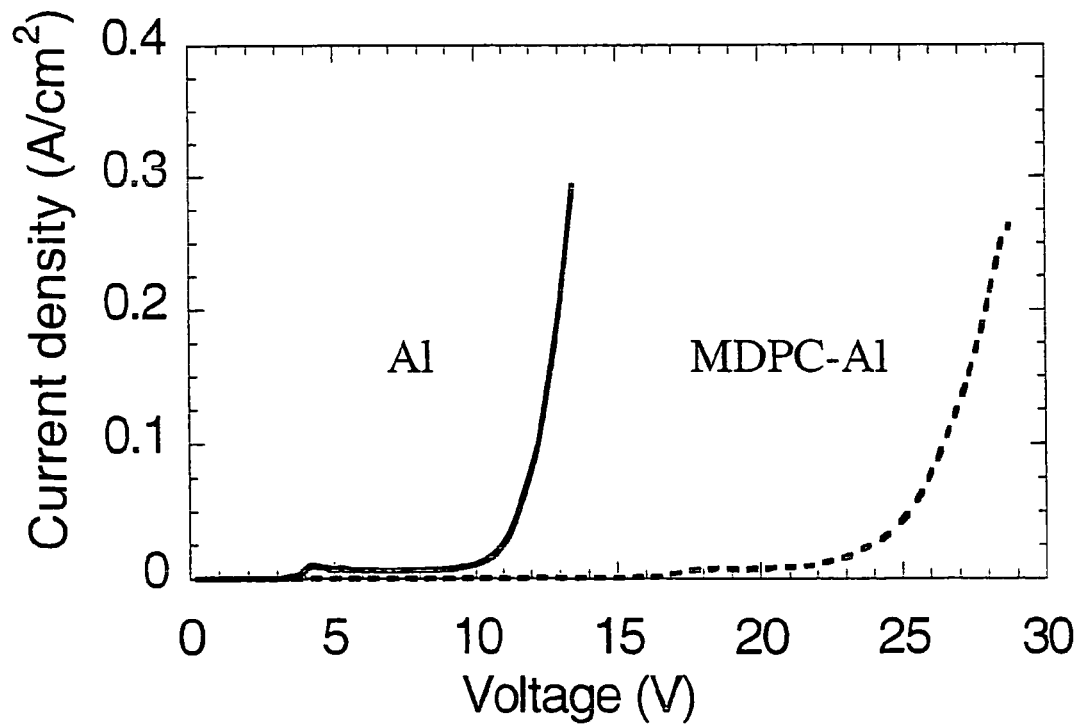
FIG. 3B shows the I-V characteristics of two OLED devices.
Figure 3C:
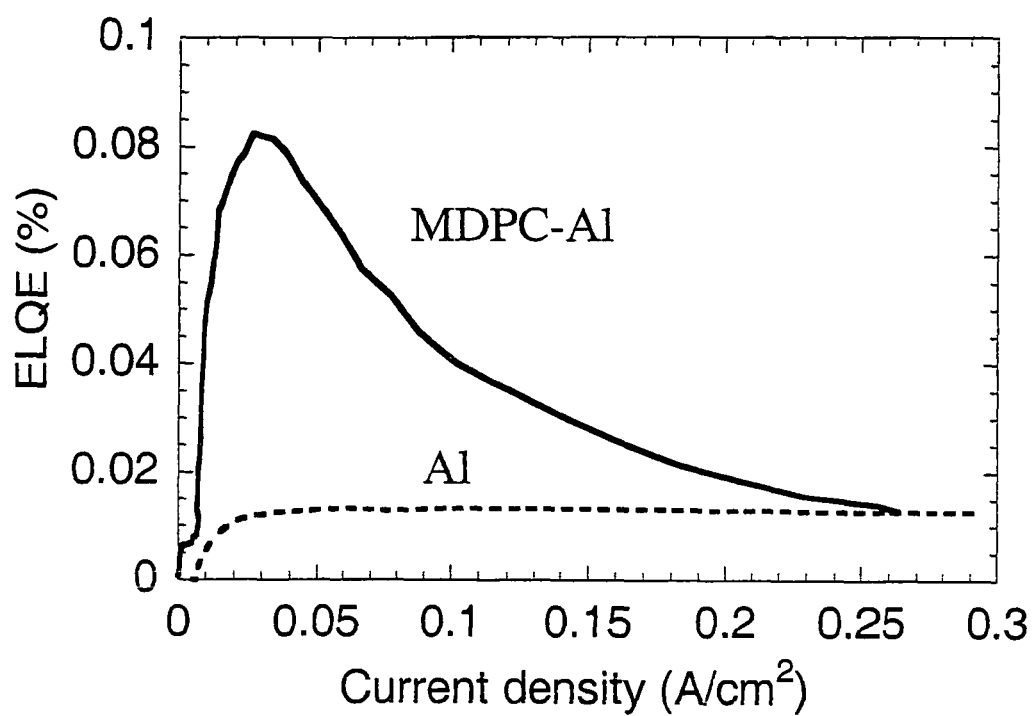
FIG. 3C shows the EL quantum efficiency of the two OLED's measured as a function of the current density.

FIG. 3B shows the I-V characteristics of the two OLED devices; dashed (full) line is for the device based on the perforated (unperforated) Al cathode. FIG. 3C shows the EL quantum efficiency of the two OLED's measured as a function of the current density; dashed and full lines as in FIG. 3B. Both devices show an abrupt onset to EL mode of operation. It is evident that the device onset biasing voltage, V based on the perforated Al (V≈20 volt) is higher compared with that of the unperforated Al electrode (V≈10 volt). Nevertheless the I-V curves indicate that the perforated Al electrode, in principle can deliver as high current densities in spite of the many holes that decorate the electron-injecting cathode.

FIG. 3C shows the ELQE of the two OLED's measured as a function of V. Admittedly the ELQE is low compared with the best values in the literature [3]. However we note that our devices do not have hole and electron intermediate transport layers, which in general increase the ELQE by at least an order of magnitude due to electron-hole balancing currents [3]. Importantly at similar current densities, J the OLED based on the perforated Al cathode shows a substantial ELQE enhancement over that based on the unperforated Al film, of up to a factor of seven at small J. At high J the enhancement is smaller, probably due to the patterned electron current density in the device, which is injected by the hole arrays Al cathode.

The EL enhancement in the device based on the perforated cathode, in principle can be due to an enhanced PL efficiency close to the holes in the cathode, where the electric field is much higher [18, 19], or simply due to the enhancement of EL transmission through the perforated Al cathode [20]. From the transmission spectra shown in FIGS. 1A and 1B, it is obvious that the latter reason is more viable. Since there is practically no transmission through the Al cathode in the unperforated OLED, then the EL emission is collected only through the Au anode with 7 percent transmission at 600 nm. In the perforated OLED, on the contrary there is extra transmission of ca 45 percent at 600 nm [25] due to the anomalous transmission of the patterned Al cathode, so that the overall transmission of the OLED may reach 52 percent at 600 nm. This represents about a seven-fold enhancement in EL collecting efficiency of the device, in good agreement with the data (FIG. 3C).

References

[1] C. W. Tang and S. A. VanSlyke, Appl. Phys. Lett. 51, 913 (1987).
[2] J. H. Burroughes, D. D. C. Bradley, A. R. Brown, R. N. Marks, K. MacKay, R. H. Friend, P. L. Burn, and a. B. Holmes, Nature (London) 347, 799 (1990).
[3] R. H. Friend, R. W. Gymer, A. B. Holmes, J. H. Burroughes, R. N. Marks, C. Taliani, D. D. C. Bradley, D. A. Dos Santos, J. L. Bredas, M. Logdlung, and W. R. Salaneck, Nature (London) 397, 121 (1999).
[4] P. A. Hobson, J. A. E. Wasey, I. Sage, and W. L. Barnes, IEEE Selec. Top. Quantum Elect. 8, 378 (2002).
[5] W. L. Barnes, P. A. Hobson, S. Wedge, J. A. E. Wasey, and I. Sage, Adv. Mater. 14, 1393 (2002).
[6] H. Raether, *Surface Plasmons on Smooth and Rough Surfaces and on Gratings,* Springer-Verlag, Berlin, 1988.
[7] T. W. Ebbesen, H. J. Lezec, H. F. Gaemi, T. Thio, and P. A. Wolff, Nature (London) 391, 667 (1998).
[8] H. F. Ghaemi, T, Thio, D. E. Grupp, T. W. Ebbesen, and H. J. Lezec, Phys. Rev. B 58, 6779(1998).
[9] T. Thio, H. F. Ghaemi, H. J. Lezec, P. A, Wolff and P. A. Ebbesen, J. Opt. Soc. Am. B 16, 1743 (1998).
[10] T. J. Kim, T. Thio, T. W, Ebbesen, D. E. Grupp, and H. J. Lezec, Opt. Lett. 24, 256 (1999).
[11] I. Avrutsky, Y. Zhao, and V. Kochergin, Opt. Lett. 25, 595 (2000).
[12] D. E. Grupp, H. J. Lezec, T. W. Ebbesen, K. M. Pellerin, and T. Thio, Appl. Phys. Lett. 77, 1569 (2000).
[13] L. Martin-Moreno, F. J. Garcia-Vidal, H. J. Lezec, K. M. Pellerin, T. Thio, J. B. Pendry, and T. W. Ebbesen, Phys. Rev. Lett. 86, 114 (2001).
[14] L. Salomon, F. Grillot, A. V. Zayats, and F. de Fornel, Phys. Rev. Lett. 86, 1110 (2001).
[15] A. M. Dykhne, A. K. Sarychev, and V. M. Shalaev, IEEE Jour. Quantum Elect. 38, 956 (2002).
[16] S. Enoch, E. Popov, M. Nevier, and R. Reinisch, J. Optics A: Pure Appi. Opt. 4, S83 (2002).
[17] A. Krishnan, T. Thio, T. J. Kim, H. J. Lezec, T. W. Ebbesen, P. A. Wolff, J. Pendry, L. Martin-Moreno, and F. J. Garcia-Vidal, Opt. Commun. 200, 1 (2002).
[18] Y. Liu and S. Blair, Opt. Lett. 28, 507 (2003).
[19] S. Gianordoli, R. Hainbrerger, A. Kock, N. Finger, E. Gornik, C. Hanke, and L. Korte, Appl. Phys. Lett. 77, 2295 (2000).
[20] D. K. Gifford and D. G. Hall, Appl. Phys. Lett. 81, 4315 (2000); ibid 80, 3679 (2002).
[21] H. Ichikawa and T. Baba, Appl. Phys. Lett. 84, 457 (2004).
[22] T. Dobbertin, O. Werner, J. Meyer, A. Kammoun, D. Schneider, T. Riedl, E. Becker, H.-H. Joannes, and W. Kowalski, Appl. Phys. Lett. 83, 5071 (2003).
[23] N. C. Greenham, I. D. W. Samuel, G. R. Hayes, R. T. Phillips, Y. A. R. R. Kessener, S. C. Moratti, A. B. Holmes, and R. H. Friend, Chem. Phys. Lett. 241, 89 (1995).
[24] R. W. Wood, Philos. Mag. 4, 396 (1902); *Proc. R. Soc. London A* 18, 269 (1902).
[25] As a matter of fact $T(\lambda)$ slightly changes after the polymer deposition; however when the angular dependence of the first maximum is taken into account, then it efficiently cover the entire PL spectrum.
[26] H. A. Bethe, *Phys. Rev.* 66, 163 (1944).

We claim:

1. An organic light-emitting diode (OLED) structure, comprising:
    an organic semiconductor polymer layer sandwiched between two electrodes;
    wherein at least one of the electrodes is perforated; and
    wherein at least the perforated electrode is at least semi-transparent.

2. The OLED structure of claim 1, wherein both of the electrodes are perforated.

3. The OLED structure of claim 1, wherein the perforated electrode is optically thick.

4. The OLED structure of claim 1, wherein the perforated electrode is metal.

5. The OLED structure of claim 1, including, a non-perforated metal electrode.

6. The OLED structure of claim 1, including an optically thin non-perforated electrode.

7. The OLED structure of claim 1, wherein the perforated electrode enhances electroluminescence.

8. The OLED structure of claim 1, wherein the perforated electrode acts as an electron-injecting cathode.

9. An organic light-emitting diode (OLED) structure, comprising:
an organic semiconductor polymer layer sandwiched between two electrodes;
wherein at least one of the electrodes is perforated; and
wherein the perforated electrode acts as a patterned, periodic two-dimensional (2D) subwavelength hole array.

10. An organic light-emitting diode (OLED) structure, comprising:
an organic semiconductor polymer layer sandwiched between two electrodes;
wherein at least one of the electrodes is perforated; and
wherein the perforated electrode forms a two-dimensional metallo-dielectric photonic crystal.

11. The OLED structure of claim 1, wherein the organic semiconductor polymer is π-conjugated.

12. The OLED structure of claim 1, wherein the organic semiconductor layer is a soluble derivative of poly-p-phenylene vinylene [PPV].

13. An organic light-emitting diode (OLED) structure, comprising:
an organic semiconductor polymer layer sandwiched between an optically thin anode and an optically thick transparent or semitransparent cathode;
wherein the cathode is perforated and acts as a patterned, periodic two-dimensional (2D) subwavelength hole array.

14. The OLED structure of claim 13, wherein
the organic semiconductor polymer is a soluble derivative of poly-p-phenylene vinylene [PPV].

* * * * *